United States Patent [19]

Lin

[11] Patent Number: 5,441,623

[45] Date of Patent: Aug. 15, 1995

[54] SPUTTERING APPARATUS FOR MAKING HIGH TEMPERATURE SUPERCONDUCTING OXIDE FILMS

[75] Inventor: Ran-Jin Lin, Hsinchu, Taiwan

[73] Assignee: Industrial Technology Research Institute, Taiwan

[21] Appl. No.: 176,725

[22] Filed: Jan. 3, 1994

[51] Int. Cl.$^6$ .................. C23C 14/34; H01L 39/24
[52] U.S. Cl. .................. 204/298.09; 204/192.24; 505/475
[58] Field of Search ............ 204/298.09, 192.24; 505/475–476, 816

[56] References Cited

U.S. PATENT DOCUMENTS 5,154,811  10/1992  Nishibori .................. 204/192.38

OTHER PUBLICATIONS

R. J. Lin et al., "In situ growth of superconducting YBa$_2$Cu$_3$O$_{7-x}$ thin films by hot–wall sputtering process", *Appl. Phys. Lett.*, vol. 62, pp. 105–107 (Jan. 1993).

Primary Examiner—Aaron Weisstuch
Attorney, Agent, or Firm—Scully, Scott, Murphy & Presser

[57] ABSTRACT

A process for making high temperature superconducting oxide films comprising using a sintered body of Y—Ba—Cu—O or Bi—Sr—Ca—Cu—O oxide as a sputtering target and using a mixture of argon and oxygen as a sputtering gas, forming glow discharge between the substrate and the target under a pressure of 0.5–2.5 torr and at a sputtering current density of 5–35 mA/cm$^2$, and then cooling the substrate after the oxide film has been grown to a desired thickness. The critical temperature of the in-situ produced superconducting oxide film of Y—Ba—Cu—O is 90 K. and that of Ba—Sr—Ca—Cu—O is 80 K.

An apparatus for the preparation of high temperature superconducting oxide films is also provided. The apparatus for in-situ making such high temperature superconducting oxide film is easy to heat the substrate and control its temperature without problems of conventional deposition methods.

7 Claims, 9 Drawing Sheets

SPUTTERING APPARATUS FOR MAKING HIGH TEMPERATURE SUPERCONDUCTING OXIDE FILMS

BACKGROUND OF THE INVENTION

The present invention relates to a process and apparatus for making high temperature superconducting oxide films, and more particularly to a single-step process for forming the superconducting films without further high temperature annealing treatment. The apparatus is unique in substrate heating, simple in structure and low in cost so as to have valuable applications.

The prior art process for the preparation of superconducting oxide films, such as Y—Ba—Cu—O and Bi—Sr—Ca—Cu—O, comprises growing oxide films on a substrate to obtain non-crystal films by heating at low temperatures or without heating and then annealing the non-crystal films at high temperatures so as to produce the superconducting oxide films. For Y—Ba—Cu—O, the annealing step should be conducted at a temperature of above 850° C. and for Bi—Sr—Ca—Cu—O, it should be at a temperature of above 800° C. Owing to the fact that the annealing step should be operated at a temperature of above 800° C., an additional high temperature furnace is necessary. Since the operating temperature is near the melting point of the materials of the substrate, the surface of the films is rough and not smooth. At the same time, the superconducting film easily reacts with the substrate to destroy the superconductivity of the films. Thus, the selectivity of the materials of the substrate is very limited in view of the consideration of high operating temperature of above 800° C. and of no reaction with superconducting oxide films. Now, useful oxide single crystals include $SrTiO_3$, YSZ ($ZrO_2$ added with $Y_2O_3$), $LaAlO_3$, MgO, etc.

In order to overcome these drawbacks, the in-situ preparation of superconducting oxide films has been developed. That is, a substrate is preheated to an adequate temperature so that the atoms of the surface of the substrate have enough energy for diffusion and reaction to form films having good crystals and after cooling, superconducting oxide films can be obtained without any further treatments. Many processes for forming films have been developed to be in-situ processes for making superconducting oxide films, such as sputtering, laser ablation, electron beam deposition, etc. In the preparation of Y—Ba—Cu—O superconducting films, the substrate should be heated to a temperature of about 700° C. and the oxygen pressure in the deposition chamber should be higher than 0.01 torr. However, problems occur. For instance, the generally used heaters for the substrate such as an infrared ray quartz lamp, wire resistor or metal block resistor are easily damaged to shorten their useful life under an environment of high temperature and high oxygen pressure. Furthermore, it is difficult to exactly measure and control the temperature of the substrate. Particularly, for an infrared ray quartz lamp, the adsorption capability of the substrate material, e.g. single crystal oxide, is low but the capability will greatly increase with the growth of the superconducting oxide film. In other words, the temperature difference of the substrate with or without superconducting film is probably more than 200° C. under the same power supply. Therefore, the reproducibility of the process for preparation of films is poor. In addition, it is also difficult to obtain an even temperature distribution on large substrates such as a surface having a diameter of 2 inches or more due to high irradiation lose at a high temperature. The manufacture of superconductors having large surface area is therefore influenced. This is a problem for conventional in-situ preparation.

To solve the above problems, the present invention discloses a simple process and apparatus for the preparation of sputtered films. In the apparatus in accordance with the present invention, a sputtering chamber, i.e., a film growing chamber or a deposition chamber is changed to a circular heat-resistant steel tube, quartz tube, or alumina tube, etc., and a sputtering target cathode and a substrate anode are all placed in the deposition chamber. The substrate is heated by a furnace surrounding the outside of the deposition chamber. The superconducting oxide films are grown in-situ by sputtering. Owing to the new apparatus for preparation of superconducting films in accordance with the present invention, the process for preparation of high temperature superconducting oxide films is more convenient than conventional ones. Particularly, in accordance with the invention, superconducting films can be produced in a single-step process.

The characteristics of the present invention also reside in the utilization of a furnace surrounding the outside of the deposition chamber to heat the substrate. The sputtering target is simultaneously heated. Hence, for film growth by a direct current sputtering method, the material of the sputtering target should be stable, specifically not decomposing at temperatures in the range of 700°–900° C., and possess high conductivity. Feenstra et al. have found that $YBa_2Cu_3O_{7-x}$ oxide materials are quite stable and do not decompose under an oxygen partial pressure of 0.1 torr and a temperature of 900° C. Further, from the research of Yamaguchi et al. on the conductivity of $YBa_2Cu_3O_{7-x}$ oxide materials, it is also found that their resistance coefficient is 0.1 $\Omega$-cm and 1 $\Omega$-cm at temperatures of 700° C. and 900° C., respectively. The above research shows that the higher the oxygen partial pressure, the more stable the target material $YBa_2Cu_3O_{7-x}$ and the better the conductivity.

Therefore, the process and apparatus in accordance with the present invention do not have the conventional problems, for instance, that the heater is easily damaged and the temperature of substrate is difficult to be determined and controlled, and the structure of the apparatus is simple so as to lower the cost of a deposition system. The present invention can be widely applied to the preparation of the superconducting films for electric devices or instruments and thus the present invention is valuable in industrial production.

SUMMARY OF THE INVENTION

It is therefore an object of the present invention to provide a process for the preparation of high temperature superconducting oxide films.

Another object of the present invention is to provide a simple single-step process for the preparation of high temperature superconducting films without any further high temperature annealing treatment.

A further object of the present invention is to provide a process for the preparation of high temperature superconducting oxide films which comprises utilizing a gas mixture of argon and oxygen as a sputtering gas, using a direct current sputtering process, controlling the pressure and electric current density in a deposition chamber for the growth of superconducting films, and introducing cooling gas to obtain superconducting oxide films with a critical temperature of above 77 K.

Yet another object of this invention is to provide an apparatus for the preparation of high temperature superconducting oxide films which can in-situ make superconducting oxide films and is simple in structure so as to lower the cost and have the potential to be commercially developed.

These and other objects, advantages, and features of the present invention will be more fully understood and appreciated by reference to the written specification.

BRIEF DESCRIPTION OF THE DRAWINGS

The present invention will be further explained with reference to the annexed drawings, wherein.

DETAILED DESCRIPTION OF THE INVENTION

The present invention relates to a process and apparatus for making high temperature superconducting oxide films, and more particularly to a single-step process for forming the superconducting films without further high temperature annealing treatment. In accordance with the present invention, the process for making high temperature superconducting oxide films comprises using a sintered body of Y—Ba—Cu—O or Bi—Sr—Ca—Cu—O oxides as a sputtering target and using a mixture of argon and oxygen gas as a sputtering gas, forming a glow discharge between the substrate and the target under a pressure of 0.5–2.5 torr and at a current density of 5–35 mA/cm$^2$ for sputtering, and then cooling the substrate after the sputtered oxide film has been grown to a desired thickness. The completion transition temperature of the in-situ produced superconducting oxide films of Y—Ba—Cu—O is 90 K. and that of Ba—Sr—Ca—Cu—O is 80 K.

The apparatus of the present invention for in-situ formation of high temperature superconducting oxide films is easy to determine and control the temperature of substrate and can avoid the problems such as damage to conventional heaters and uneven temperature distribution on the surface of a large substrate.

Figure 1:
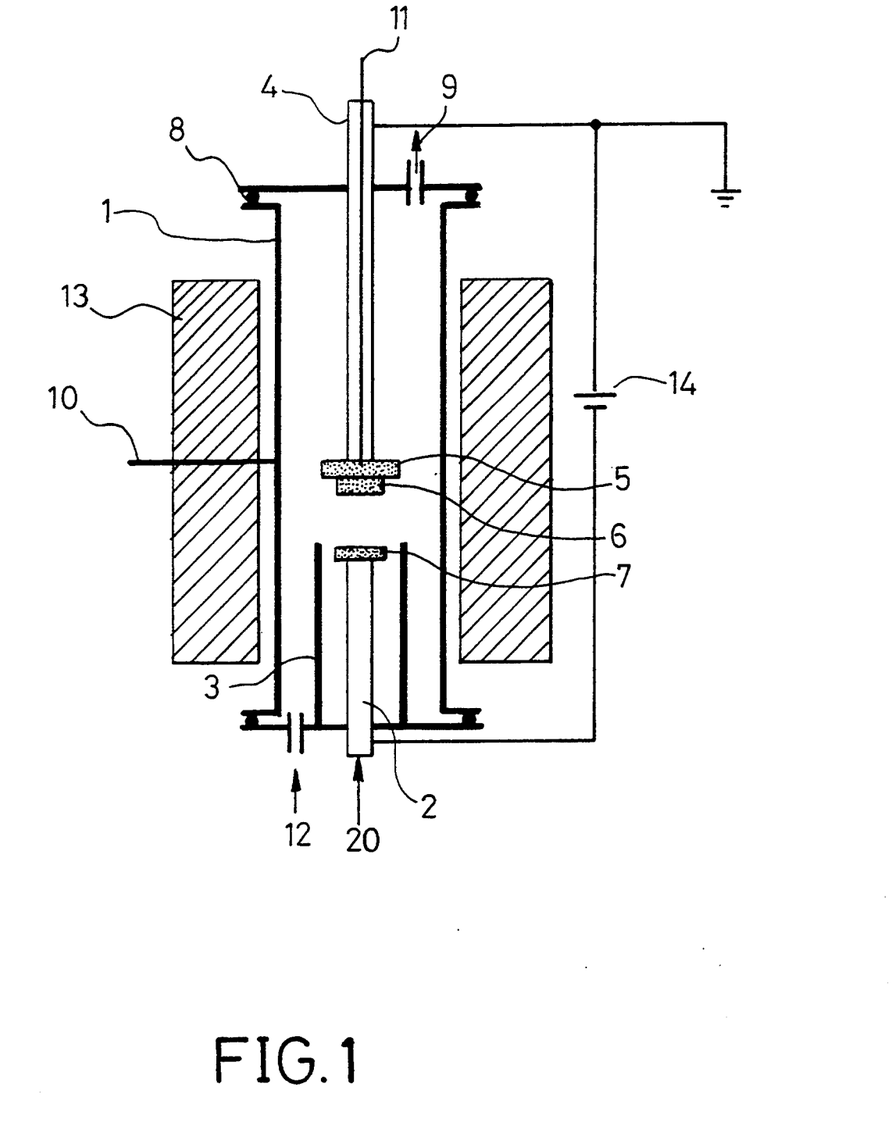
FIG. 1 is a schematic structure of the basic apparatus in accordance with the present invention.

The apparatus of the invention will be described in detail as follows. FIG. 1 is a schematic view showing the structure of the basic apparatus used for carrying out the present invention, comprising a circular tube deposition chamber (1) i.e., film growing zone or sputtering zone, an anode (4) with a substrate holder (5), a cathode (2) with a sputtering target (7), a cathode shielding (3), and a furnace (13). The substrate (6) is set on the substrate holder (5). The cathode shielding (3) surrounds the cathode (2) and the sputtering target (7). The furnace (13) surrounds the tube deposition chamber (1) to heat the substrate (6) in the deposition chamber (1). In order to determine and control the temperature of the substrate, thermocouples (10) and (11) are provided in the apparatus.

A sintered body of oxides such as Y—Ba—Cu—O or Bi—Sr—Ca—Cu—O is fixed by a silver gel on the top of the cathode (2) for use as the sputtering target (7). The distance between the cathode shielding (3) and the sputtering target (7) is adjusted to be less than 0.5 mm. The relative position of the cathode (2) to the anode (4) in the deposition chamber (1) is opposite, or perpendicular, or at a slant angle. The mixture of argon and oxygen gas for use as a sputtering gas and pure oxygen are introduced into the deposition chamber (1) through an inlet (12) and exhausted from an outlet (9). Several O-shaped gaskets (8) are used to seal the deposition chamber (1). When the gas pressure in the deposition chamber is proper, the power supply (14) is started to ionize the sputtering gas for the growth of superconducting films.

The materials of the circular tube deposition chamber (1) may be quartz, alumina, stainless steel, nickel, and superalloy. The anode (4) and the substrate holder (5) may be made of stainless steel, nickel and superalloy in a shape of a tube or stick and a plate, respectively. The cathode (2) may be made of copper, stainless steel, nickel, and superalloy, and cooling water would be inlet into the cathode via a tube for cooling. The cathode shielding may be made of quartz tube or alumina tube. The furnace to heat the substrate is made in a tube shape is made of resistance wire, resistance bar, or infrared ray quartz lamp. In addition, the material of the deposition chamber in the present invention has been changed to a cheap material such as a quartz tube rather than a conventional expensive complicated stainless steel chamber. This will greatly simplify the system for the preparation of superconducting oxide films and reduce its cost for economical development.

The process for the preparation of high temperature superconducting oxide films in accordance with the invention, particularly according to the structure of the sputtering apparatus comprises the steps as follows:

(a) respectively placing a substrate on an anode and a sintered body of an oxide superconductor on an cathode in a deposition chamber, wherein the sintered body on the cathode is used as a sputtering target;

(b) adjusting the positions of the cathode and the anode so as to control the distance between the surface of the substrate and the surface of the sputtering target;

(c) exhausting gases from the deposition chamber to a pressure of below $10^{-3}$ torr and then introducing pure oxygen to a pressure of 1 atmosphere;

(d) heating the substrate to a desired temperature under a pressure of 1 atmosphere in the deposition chamber;

(e) exhausting gases from the deposition chamber again and then introducing a mixture of argon and oxygen gas at a proper ratio and to maintain a desired pressure by an automatic pressure-control valve;

(f) starting an electric power supply to produce glow discharge between the substrate and the sputtering target so as to grow a superconducting oxide film to a desired thickness; and (g) cooling the substrate to a temperature below 100° C. to in-situ obtain the high temperature superconducting oxide films.

In accordance with the present invention, the step (f) of the process also comprises controlling the sputtering current density so that excellent superconducting films are produced and a sufficient high rate of growth is maintained during the growth of the superconducting films. In other words, the sputtering current density is controlled to ensure that the composition of the films is the same as that of the sputtering target and to obtain excellent superconductivity. When the superconducting film has grown to a desired thickness, different procedures and atmospheres are used to complete the cooling according to the selected material of the sputtering target. For instance, when the desired thickness of $YBa_xCu_yO_{7-\delta}$ superconducting oxide film is reached, pure oxygen is introduced into the deposition chamber and a cooling step is conducted by furnace-cooling or by controlling the temperature to below 100° C. under a pressure of between 200 torr and 1 atmosphere to obtain the Y—Ba—Cu—O high temperature superconducting oxide film. Further, when the desired thickness of BiSrCaxCuyOz superconducting film is reached, the film is immediately quenched in air and then the Bi—Sr—Ca—Cu—O high temperature superconducting oxide film is obtained.

Therefore, the process for the preparation of superconducting films in the present invention comprises using the sintered body of Y—Ba—Cu—O or Bi—Sr—Ca—Cu—O oxide as a sputtering target. In other words, the component of the target is $YBa_xCu_yO_{7-\delta}$, wherein $1.5 \leq x \leq 3$ and $2.5 \leq y \leq 3.5$ or BiSrCaxCuyOz, wherein $0.5 \leq x \leq 1.5$ and $1 \leq y \leq 2$. The sputtering target is fixed by silver gel on the top of the cathode. On the other hand, the substrate which has been treated by known methods such as cleaning by use of organic solvents is attached to the substrate holder which is connected to the anode. The positions of the cathode and the anode are adjusted to maintain the distance between the surface of the target and the surface of the substrate in a range of 1.5-4 cm. The material of the substrate may be Si, $SiO_2$, $Al_2O_3$, MgO, $SrTiO_3$, YSZ, and $LaAlO_3$ (single crystal or polycrystal). Furthermore, the substrate may also be made of a metal such as Ni, Ni based superalloy, Ag, Au, and Pt.

After the positions of the sputtering target and the substrate are properly placed, the deposition chamber (1) is exhausted by a vacuum pump such as a mechanical pump plus a turbo-pump to about $1 \times 10^{-4}$ torr or less. After exhaustion is completed, pure oxygen is introduced into the deposition chamber to maintain the atmosphere of the deposition chamber at 1 atm. The substrate is heated by the furnace (13) to a temperature of 650°-810° C. Subsequently, a mixture of argon and oxygen with the volume percentage of oxygen in the range of 20-80% is used to replace the original pure oxygen. Then the deposition chamber is exhausted again, followed by maintaining gas pressure at a pressure of 0.5-2.5 torr by using an automatic pressure-control valve to adjust the exhausting rate of the vacuum pump. The DC power supply (14) is started to partially ionize the sputtering gas so as to produce the glow discharge. The electric current is controlled in the range of 0.1-0.4 A and the sputtering voltage is in the range of 160-240 V. That is, the current density for the production of glow discharge is controlled in the range of 5-35 $mA/cm^2$ so as to grow superconducting films. Generally, the growth rate of the film on the substrate is in the range of 0.5-1 Å/sec and the desired thickness of the film is in the range of 0.2-1 $\mu m$. As a certain desired thickness of the film is obtained, the power supply for direct electric current is turned off and the sputtering for film growth is stopped. Then the deposition chamber is supplied with pure oxygen or air so that the pressure of the deposition chamber is maintained at 1 atmosphere. The substrate is cooled to below 100° C. The resultant products of the present invention are the high temperature superconducting oxide films of Y—Ba—Cu—O and Bi—Sr—Ca—Cu—O having a completion transition temperature of about 90 K. and 80 K., respectively. Furthermore, the reproducibility of the process of the present invention is quite excellent.

In the present invention, the manner for heating the substrate by a furnace surrounding the outside of the deposition chamber is better than that used now, such as infrared ray quartz lamp, resistance wire, or metal block resistor, etc., which is located inside of the deposition chamber. Therefore, the advantages of the present invention include extending the durability of the substrate heater, reducing the times for changing the heater due to damage, easily controlling the substrate temperature, increasing the reproducibility of the process due to small variation of the temperature, easily establishing preferable parameters for the film growth and obtaining an even temperature distribution of the substrate, particularly for large substrates such as a substrates having a diameter of above 2 inch.

It has been demonstrated by embodiments that the properties of the obtained high temperature superconducting oxide films of present invention are equivalent to those of other processes. Besides, the film deposition rate of about 1 Å/m is comparable to that of other processes. Furthermore, the apparatus of the present invention is simple in structure and low in cost. The heating pattern of the present invention is quite better than that of conventional methods and particularly suitable for having an even temperature distribution on a substrate having a large surface area such as a surface having a diameter of above 2 inch. Therefore, the process for preparation of high temperature superconducting oxide films in accordance with the present invention has great commercial potential.

In addition, the process of the present invention utilizing the DC power supply to ionize the sputtering gas will limit the growing of films on the conductive materials of the sputtering targets. If a radio-frequency power supply is used, the films can be grown on the conductive or the non-conductive materials of the targets.

Then, after the components of the target are changed, the process of the present invention can be utilized to produce other non-oxide high temperature superconducting films. It is clearly shown that the process of the present invention is a very useful process for preparation of general films and particularly can be widely applied to prepare superconducting films of various materials.

The following examples are offered by way of illustration. The examples are not intended to limit the scope of the invention in any respect and should not be so construed.

EXAMPLES

EXAMPLE 1

A body of $YBa_2Cu_3O_x$ with a diameter of 45 mm was used as the sputtering target (7) and was fixed by silver gel on the top of the cathode (2). A (100) MgO single crystal, which had been cleaned by an organic solvent, was used as the substrate (6) and attached to the substrate holder (5). The substrate holder (5) was connected to the anode (4). The distance between the surface of target and the surface of substrate was maintained at about 2 cm by adjusting the positions of the anode and the cathode. After the sputtering target and the substrate were respectively installed, the deposition chamber was exhausted by a vacuum pump to a pressure of below $1 \times 10^{-4}$ torr. Then the pump was turned off. Then pure oxygen was introduced to maintain the gas pressure of the deposition chamber at about 1 atm. The substrate was then heated to a temperature of 670° C. Opening the vacuum pump again, a mixture of argon and oxygen gases at a ratio of 1:1 was used to replace the pure oxygen and used as the sputtering gas. The pressure of the deposition chamber was controlled at 1.5 torr. Subsequently, the DC power supply was started to partially ionize the sputtering gas so as to produce glow discharge. The sputtering current was controlled at 0.3 A and the sputtering voltage was 180 V. After the film was grown for about 180 minutes, a film having a thickness of about 1 μm was obtained. The electric power supply and the pump were turned off. The oxygen was introduced to have a pressure of 1 atm. After the furnace was cooled to the ambient temperature, a Y—Ba—Cu—O high temperature superconducting oxide film was produced.

The above procedures were repeated, but the substrate was heated to different temperatures in the range of 650°–810° C.

Figure 2:
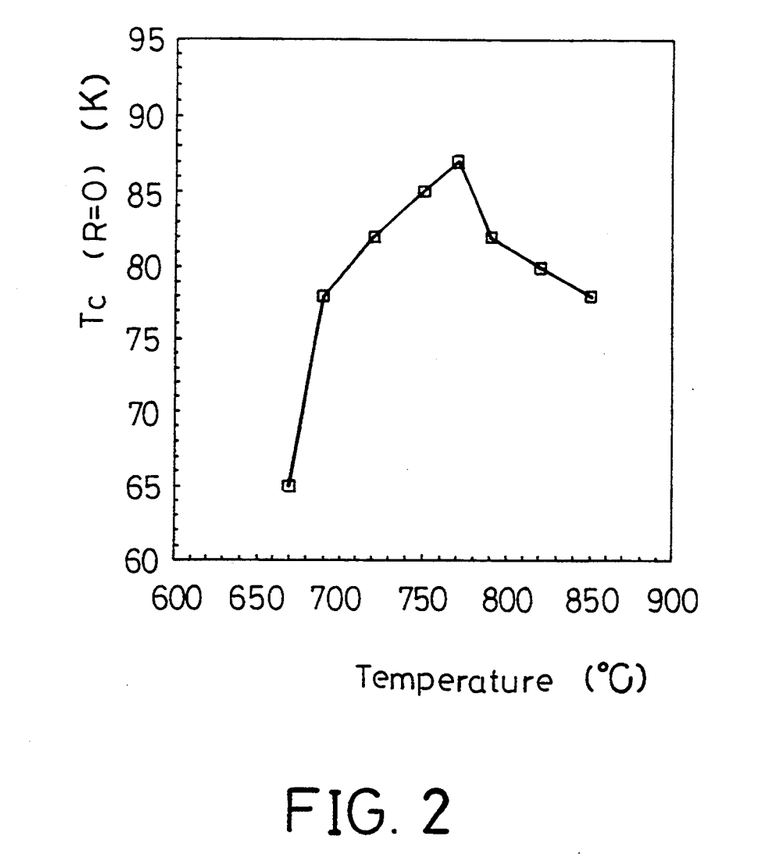
FIG. 2 is a diagram showing the relation of the temperature of the substrate for the superconducting films obtained in Example 1 to the completion transition temperature of YBaCuO films.

The completion transition temperatures of the obtained superconducting films were determined and the results are shown in FIG. 2. It was found that the superconductivity of the obtained film is best, e.g., having a completion transition temperature of 87 K., when the substrate is heated to a temperature of 760° C.

EXAMPLE 2

The procedures of Example 1 were repeated except the substrate was heated to a temperature of 700° C. and different pressures of the mixture of argon and oxygen gases in the deposition chamber were used to produce Y—Ba—Cu—O high temperature superconducting oxide films.

Figure 3:
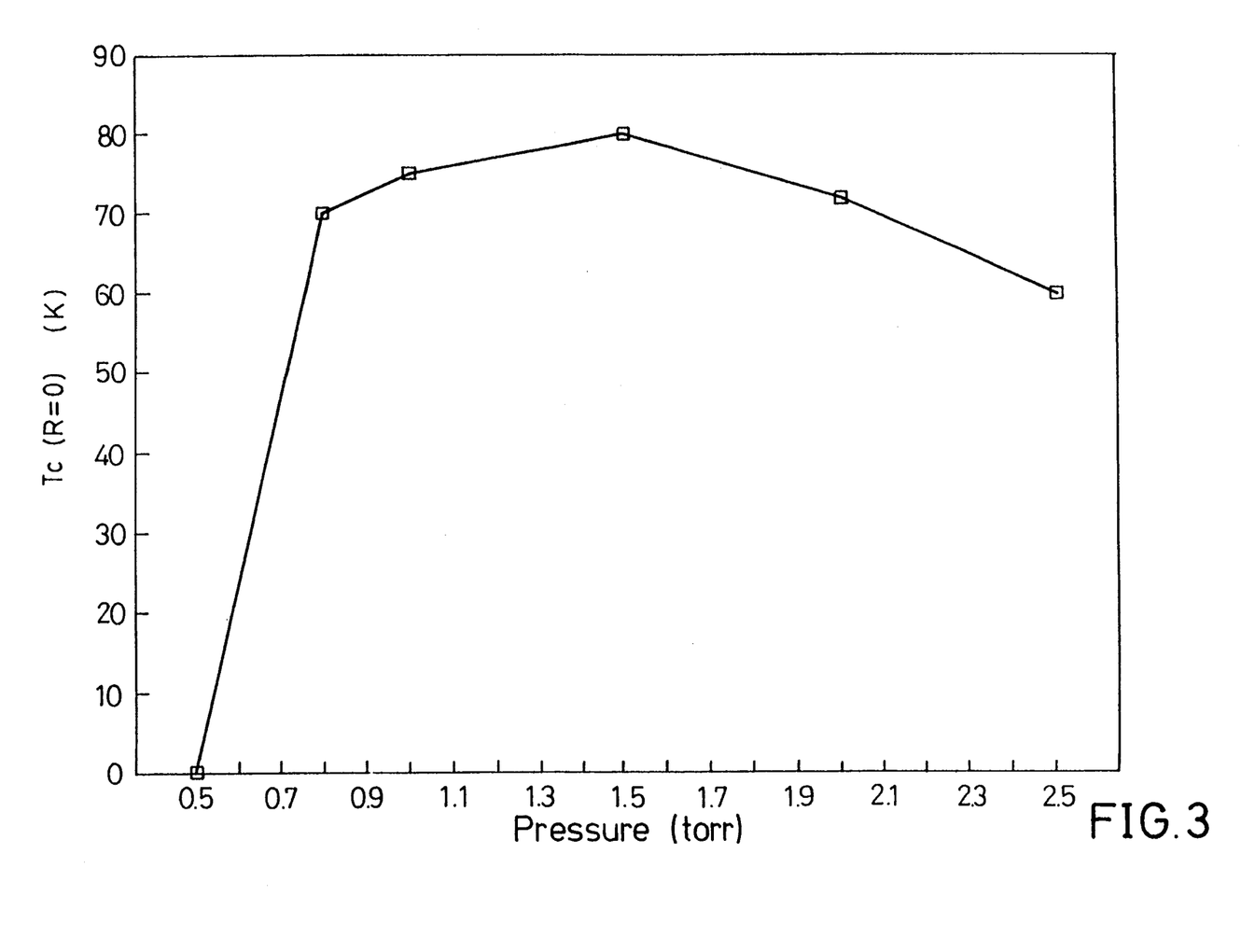
FIG. 3 is a diagram showing the relation of the pressure of the sputtering gas for the superconducting films obtained in Example 2 to the completion transition temperature of YBaCuO films.

The completion transition temperatures of the obtained superconducting films were determined and the results were shown in FIG. 3. It was found that the superconductivity of the obtained film is best, e.g., having a completion transition temperature of 80 K., when the gas pressure of the deposition chamber is 1.5 torr.

EXAMPLE 3

The procedures of Example 1 were repeated except the material of substrate was replaced by (111) Si or (1012) $Al_2O_3$ of which the surface was first coated with a YSZ film with a thickness of 1000 Å, and the substrate was heated to a temperature of 740° C. for the preparation of Y—Ba—Cu—O high temperature superconducting oxide films.

Figure 4A:
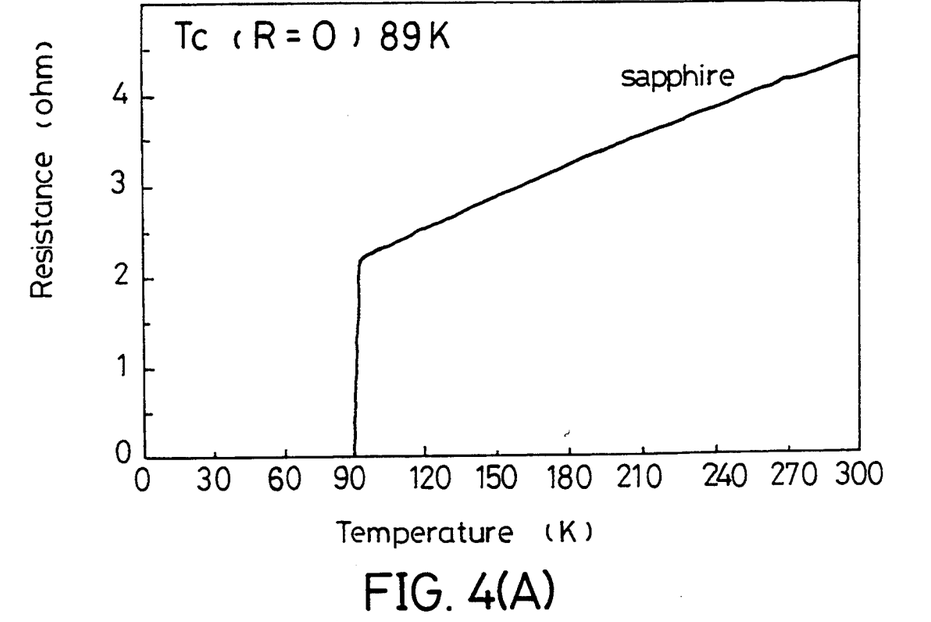
FIGS. 4(A) and 4(B) are diagrams showing the relation of resistance to temperature of the superconducting YBaCuO film grown on $Al_2O_3$ (1012) and Si (111) single crystal (on which there has been grown a YSZ film with a thickness of 1000 Å) in Example 3.
Figure 4B:
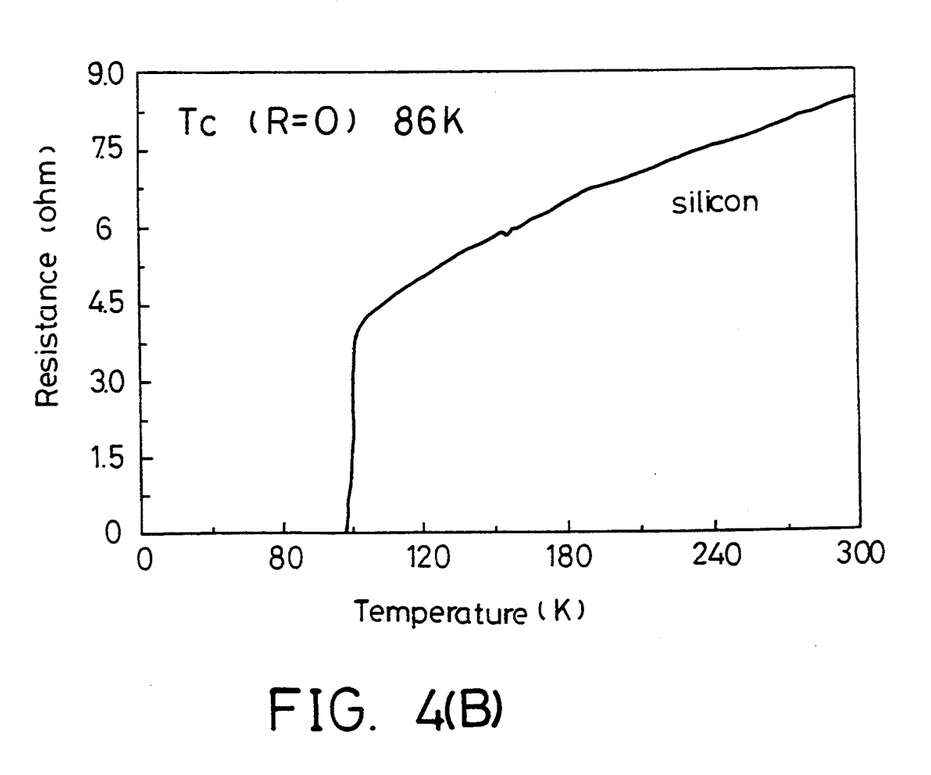

The resistance vs. temperature curves of the obtained superconducting films were determined and the results are shown in FIG. 4. It is seen that the respective completion transition temperatures of the films are 89 K. and 86 K.

EXAMPLE 4

The procedures of Example 1 were repeated except the substrate was replaced by (100) MgO, (100) YSZ, (100) $LaAlO_3$, or (100) $SrTiO_3$, and the substrate was heated to a temperature of 760° C. during the preparation of Y—Ba—Cu—O high temperature superconducting oxide films with a thickness of 2,000–4,000 Å.

Figure 5:
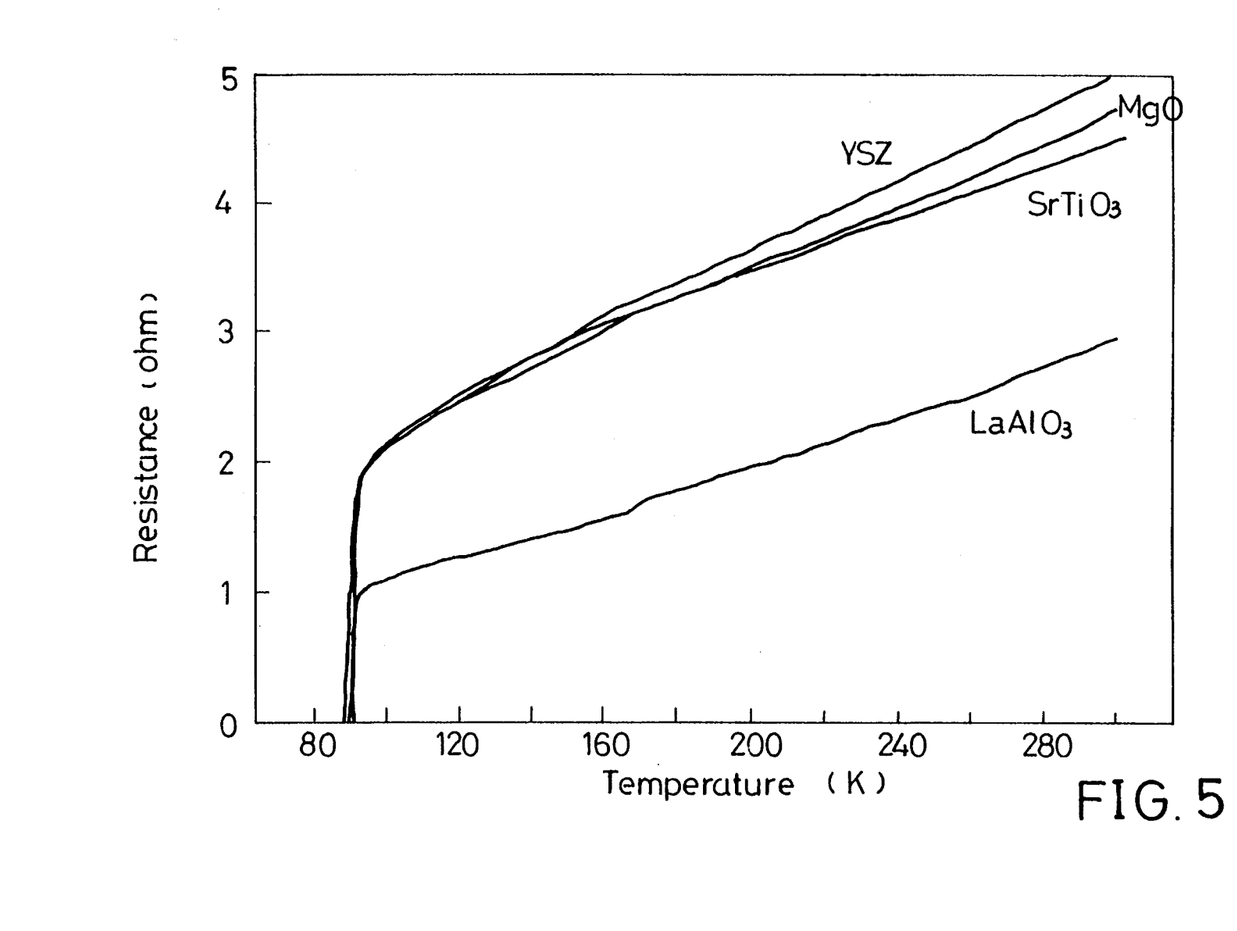
FIG. 5 is a diagram showing the relation of the substrate materials for the superconducting films obtained in Example 4 to the completion transition temperature of YBaCuO films.

The resistance vs. temperature curves of the obtained superconducting films were determined and the results are shown in FIG. 5. It is seen that the respective completion transition temperatures are 87 K., 89 K., 89 K., and 91 K. for the Y—Ba—Cu—O films grown on the above-mentioned different substrates. The critical current density of the above-mentioned films at a temperature of 77 K. is above $1 \times 10^6$ $A/cm^2$.

EXAMPLE 5

The procedures of Example 1 were repeated except the conditions were changed. First, the sputtering target was changed to $Bi_2Sr_2CaCu_2O_x$, the sputtering current was changed to 0.2 A, and the sputtering voltage was changed to 220 V. The substrate material was (100) MgO single crystal. After the desired thickness of the films were obtained at different substrate temperatures, the grown films were immediately quenched in air so that the products were quickly cooled. The resultant products were Bi—Sr—Ca—Cu—O high temperature superconducting oxide films.

Figure 6:
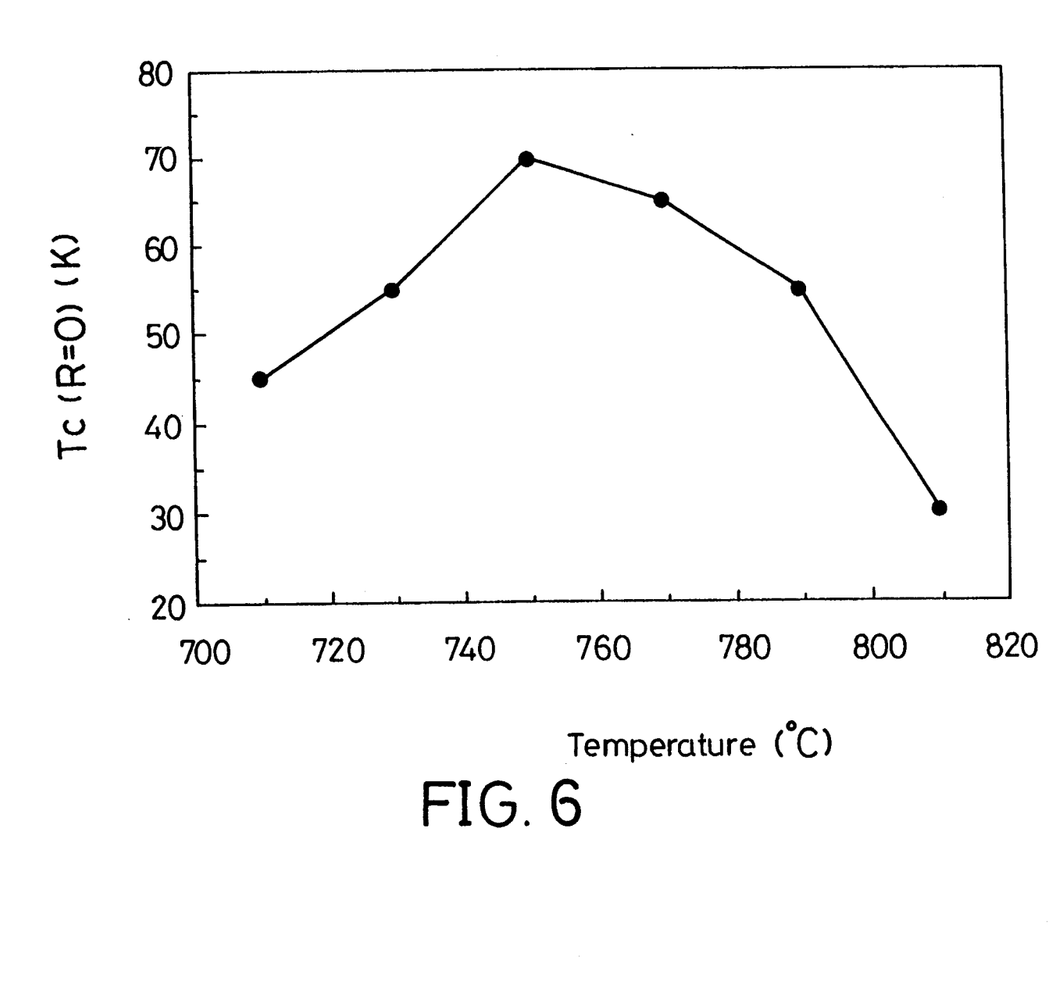
FIG. 6 is a diagram showing the relation of the temperature of the substrate for the superconducting films obtained in Example 5 to the completion transition temperature of BiSrCaCuO films.

The completion transition temperatures of the obtained superconducting films were determined and the results were shown in FIG. 6. It was found that the superconductivity of the obtained films is best, e.g., having a completion transition temperature of 70 K., when the substrate is heated to a temperature of 750° C.

EXAMPLE 6

The procedures of Example 5 were repeated, except that different target materials were used to produce Bi—Sr—Ca—Cu—O high temperature superconducting oxide films. The substrate was heated to a temperature of 750° C.

Figure 7A:
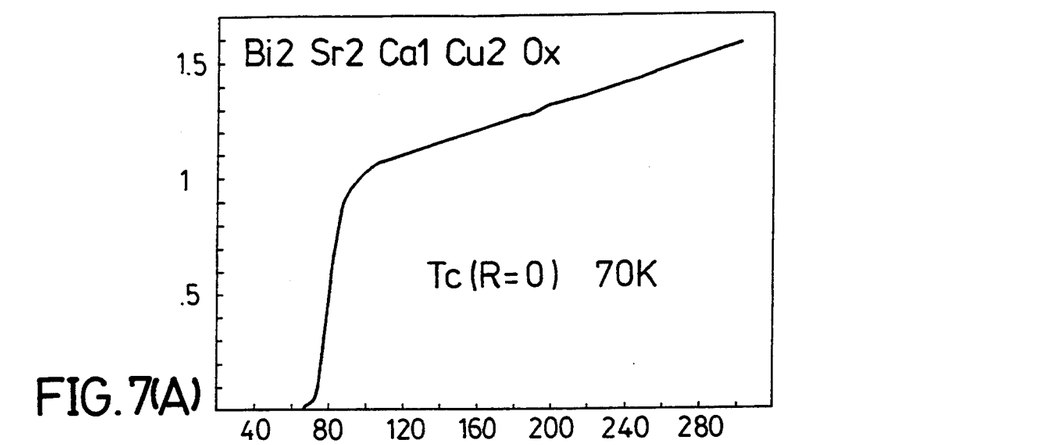
FIGS. 7(A)–7(C) are diagrams showing the relation of the composition of the target material for the superconducting films obtained in Example 6 to the completion transition temperature of BiSrCaCuO films.
Figure 7B:
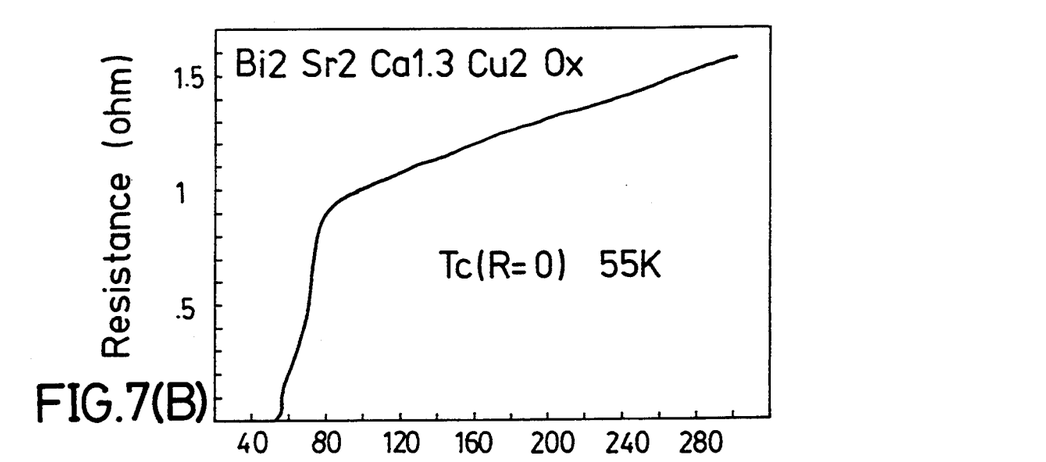
Figure 7C:
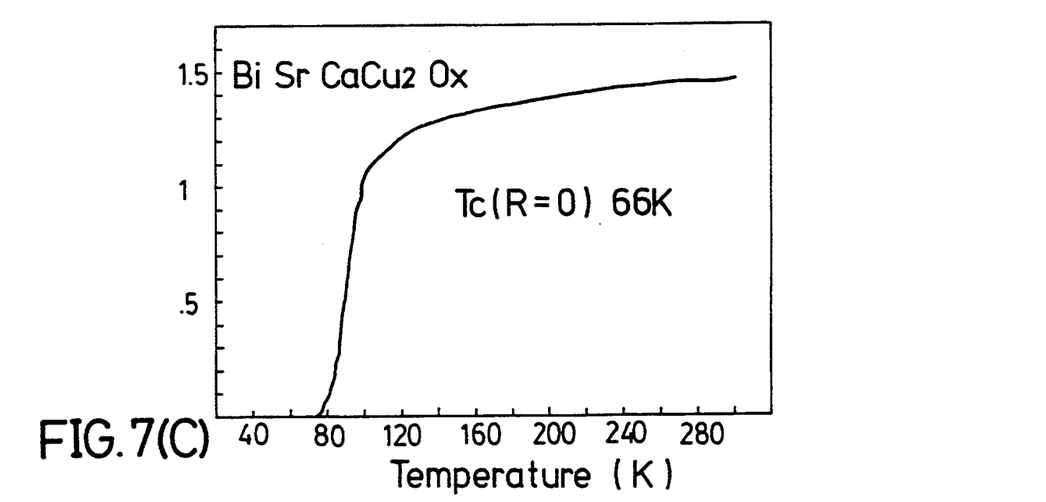

The resistance vs. temperature curves of the obtained superconducting films were determined and the results are shown in FIG. 7. It was found that the completion transition temperatures of the obtained superconducting films by utilizing different target materials are in the range of 55–70 K.

EXAMPLE 7

The procedures of Example 5 were repeated, except that the sputtering target was changed to BiSr- CuCu₂Ox, the substrate was heated to a temperature of 750° C., and different sputtering currents were used to produce Bi—Sr—Ca—Cu—O high temperature superconducting oxide films.

Figure 8:
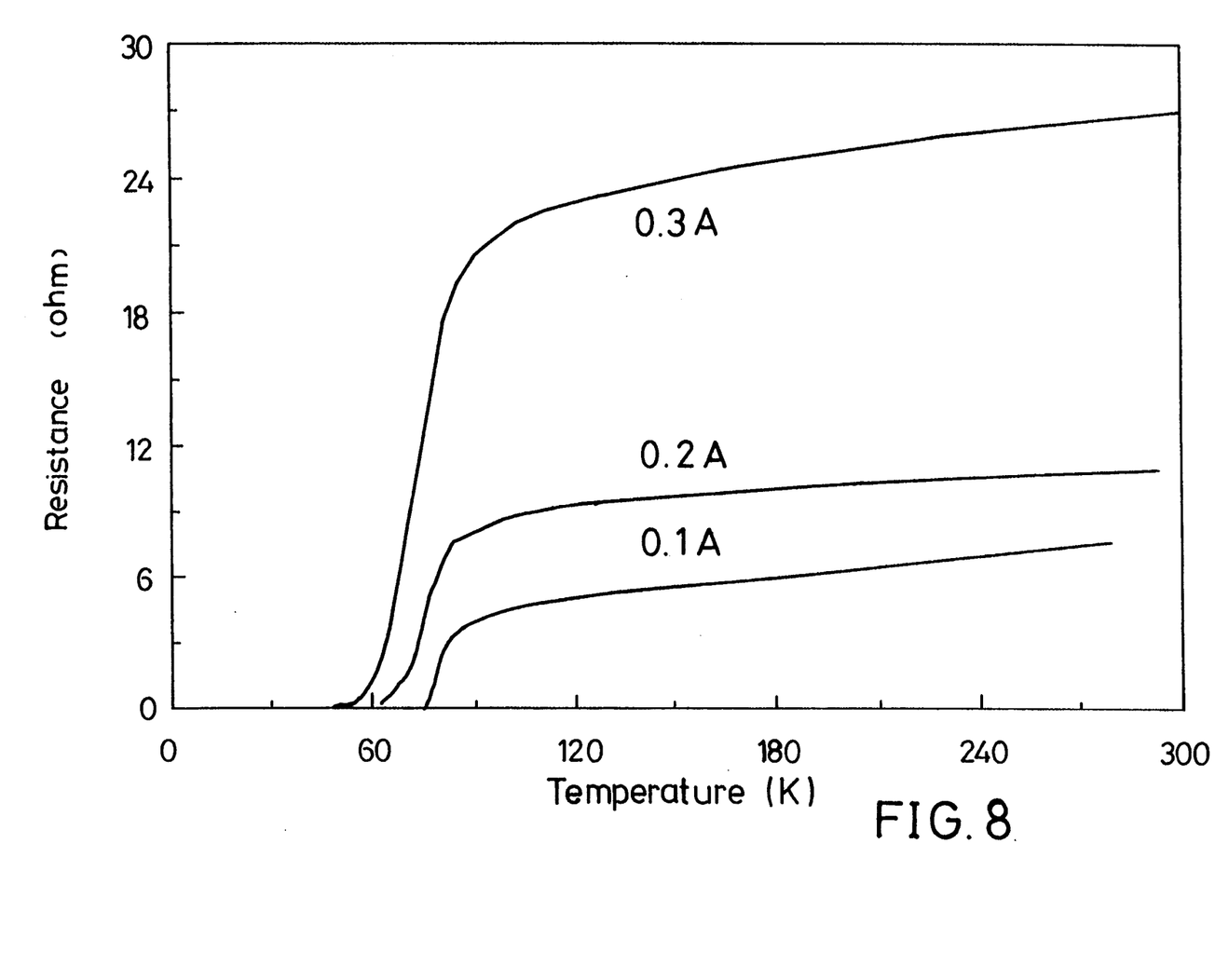
FIG. 8 is a diagram showing the relation of the sputtering current for the superconducting films obtained in Example 7 to the completion transition temperature of BiSrCaCuO films.

The resistance vs. temperature curves of the obtained superconducting films were determined and the results are shown in FIG. 8. It was found that higher completion transition temperatures of the resultant superconducting films are obtained at low sputtering current and the value is of 79 K.

EXAMPLE 8

The procedures of Example 7 were repeated except the sputtering current was changed to 0.1 A and different substrate temperatures were used to produce Bi—Sr—Ca—Cu—O high temperature superconducting oxide films.

Figure 9:
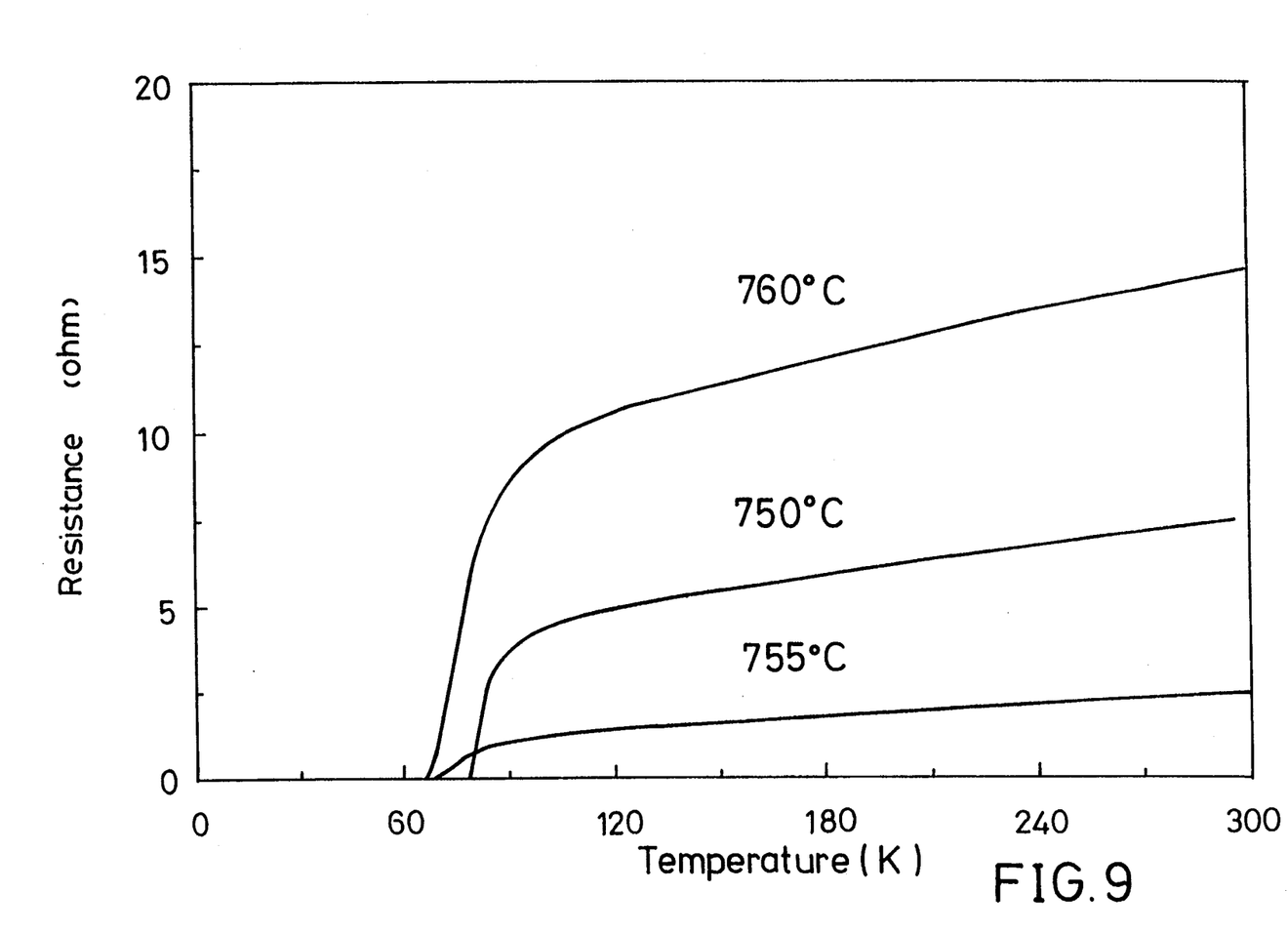
FIG. 9 is a diagram showing the relation of the temperature of the substrate for the superconducting films obtained in Example 8 to the completion transition temperature of BiSrCaCuO films.

The resistance vs. temperature curves of the obtained superconducting films were determined and the results are shown in FIG. 9. It is seen that there is a strong influence by the substrate temperatures on the completion transition temperatures of Bi—Sr—Ca—Cu—O high temperature superconducting oxide films. The highest value of the completion transition temperature is 79 K.

The above description is given of the preferred embodiments of the invention, but it will be apparent that many modifications and variations could be effected by one skilled in the art without departing from the spirit or scope of the novel concepts of the invention, so that the scope of the invention should be determined by the appended claims only.

I claim:

1. An apparatus for the preparation of high temperature superconducting oxide films, comprising:
    (a) a circular tube deposition chamber;
    (b) an anode connected to a substrate holder at one end thereof in the deposition chamber;
    (c) a cathode connected to a sputtering target at one end thereof in the deposition chamber;
    (d) a cathode shield surrounding the cathode and the sputtering target; and
    (e) a furnace surrounding the outside of the tubular deposition chamber to heat a substance mounted on the substrate holder in the deposition chamber.

2. The apparatus of claim 1, wherein the material of the circular tube deposition chamber is selected from the group consisting of quartz, alumina, stainless steel, nickel, and superalloy.

3. The apparatus of claim 1, wherein the anode and the substrate holder are made of stainless steel, nickel, or superalloy, in the shape of a tube or bar.

4. The apparatus of claim 1, wherein the cathode is made of copper, stainless steel, nickel, or nickel-based superalloy.

5. The apparatus of claim 1, wherein the cathode shield is made of quartz tube or alumina tube.

6. The apparatus of claim 1, wherein the cathode and the anode are placed in the deposition chamber in an opposing or perpendicular position or at a slant angle.

7. The apparatus of claim 1, wherein the tubular furnace is composed of a wire resistor, bar resistor, or infrared ray quartz lens to heat the deposition chamber and the substrate therein.

* * * * *